(12) United States Patent
Bednar et al.

(10) Patent No.: US 7,096,436 B2
(45) Date of Patent: Aug. 22, 2006

(54) MACRO DESIGN TECHNIQUES TO ACCOMMODATE CHIP LEVEL WIRING AND CIRCUIT PLACEMENT ACROSS THE MACRO

(75) Inventors: Thomas R. Bednar, Essex Junction, VT (US); Paul E. Dunn, Fletcher, VT (US); Scott W. Gould, South Burlington, VT (US); Jeannie H. Panner, Underhill, VT (US); Paul S. Zuchowski, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 10/946,552

(22) Filed: Sep. 21, 2004

(65) Prior Publication Data

US 2005/0039153 A1 Feb. 17, 2005

Related U.S. Application Data

(62) Division of application No. 10/403,626, filed on Mar. 31, 2003, now Pat. No. 6,883,155, which is a division of application No. 09/526,198, filed on Mar. 15, 2000, now Pat. No. 6,543,040.

(51) Int. Cl.
*G06F 17/50* (2006.01)
(52) U.S. Cl. .................... 716/1; 707/1; 711/4
(58) Field of Classification Search .............. 716/1, 716/8, 12–13; 707/1; 711/4
See application file for complete search history.

(56) References Cited

U.S. PATENT DOCUMENTS

| | | | |
|---|---|---|---|
| 5,072,402 A | 12/1991 | Ashtaputre et al. | 364/491 |
| 5,349,248 A | 9/1994 | Parlour et al. | 307/465 |
| 5,485,396 A | 1/1996 | Brasen et al. | 364/491 |
| 5,498,979 A | 3/1996 | Parlour et al. | 326/38 |
| 5,550,839 A | 8/1996 | Buch et al. | 371/22.1 |
| 5,623,420 A | 4/1997 | Yee et al. | 364/490 |
| 5,638,288 A | 6/1997 | Deeley | 364/489 |
| 5,761,078 A | 6/1998 | Fuller et al. | 364/489 |
| 5,894,482 A | 4/1999 | Motohara | 371/22.5 |

(Continued)

FOREIGN PATENT DOCUMENTS

JP   3-50848   3/1991   ............ 21/82

(Continued)

OTHER PUBLICATIONS

Kurdahi, F.J., et al., "Techniques for area estimation of VLSI layouts", IEEE, Jan. 1989, pp. 81-92.

*Primary Examiner*—Stacy A. Whitmore
(74) *Attorney, Agent, or Firm*—Richard M. Kotulak, Esq.; Kevin P. Radigan, Esq.; Heslin Rothenberg Farley & Mesiti, P.C.

(57) ABSTRACT

Macro design techniques are disclosed for facilitating subsequent stage wiring across the macro. Whitespace areas within the macro are rearranged to accommodate the wiring. The rearrangement may take the form of physical rearrangement of the whitespace areas into routing tracks extending from one side of the macro to another; shielding using, for example, macro power bussing and/or macro wiring; routing power busses to the rearranged whitespace; and/or inserting active circuits with pins accessible to the wiring. In a preferred embodiment, active circuits are placed into rearranged macro whitespace during the design of subsequent stages. The rearrangement of the whitespace facilitates the wiring across the macro so that slew rate and path delay requirements of the subsequent stage wiring can be maintained, without excessive buffering or rerouting of wiring.

9 Claims, 7 Drawing Sheets

U.S. PATENT DOCUMENTS

| | | | |
|---|---|---|---|
| 5,987,241 A | 11/1999 | Goldberg et al. | 395/500.15 |
| 6,226,775 B1 | 5/2001 | Yamada | 716/2 |
| 6,253,364 B1 | 6/2001 | Tanaka et al. | 716/13 |
| 6,378,121 B1 | 4/2002 | Hiraga | 716/13 |

FOREIGN PATENT DOCUMENTS

| | | | |
|---|---|---|---|
| JP | PUPA 04-044342 | 12/1992 | |
| JP | PUPA 05-151313 | 6/1993 | |
| JP | 7-14927 | 7/1995 | 21/82 |
| JP | PUPA 09-116018 | 5/1997 | |
| JP | 9-64190 | 9/1997 | 21/82 |
| JP | PUPA 10-223869 | 8/1998 | |
| JP | PUPA 10-256382 | 9/1998 | |
| JP | 10-92939 | 10/1998 | 21/82 |
| JP | PUPA 11-067923 | 3/1999 | |

MACRO DESIGN TECHNIQUES TO ACCOMMODATE CHIP LEVEL WIRING AND CIRCUIT PLACEMENT ACROSS THE MACRO

CROSS-REFERENCE TO RELATED APPLICATIONS

This application is a divisional of U.S. patent application Ser. No. 10/403,626, filed Mar. 31, 2003 now U.S. Pat. No. 6,883,155, entitled "Macro Design Techniques To Accommodate Chip Level Wiring and Circuit Placement Across the Macro", which is a divisional of U.S. patent application Ser. No. 09/526,198, filed Mar. 15, 2000 now U.S. Pat. No. 6,543,040, entitled "Macro Design Techniques To Accommodate Chip Level Wiring and Circuit Placement Across the Macro", the entirety of each of which is hereby incorporated herein by reference.

TECHNICAL FIELD

The present invention relates to integrated circuits. More particularly, the present invention relates to pre-designing hard macros, or other hierarchically designed entities, within integrated circuits to accommodate a combination of subsequent stage wiring and circuit insertion across the macros.

BACKGROUND OF THE INVENTION

It is well-known that with increasing circuit densities, timing requirements, and bus capacities in integrated circuit chips, wiring widths must be decreased. Decreased wiring widths, however, leads to increased resistances, impacting the slew rate and path delay of the wiring. Wiring must comply with a maximum slew rate and minimum delay based on the required timing. This wiring problem is aggravated when macro "blocks" occupy otherwise open space on the integrated circuit plan. These macros often interfere with subsequently-designed wiring paths which must comply with the slew rate and delay requirements.

To illustrate these problems, and with reference to FIG. 1, an IC 10 may include an embedded macro 12 having remnant silicon and/or wiring whitespace areas $24_1 \ldots 24_4$. Assume that IC wiring is required from region 14 to region 16 of the IC. Running wiring across the macro may not be possible, since design tools usually see the macro as a fixed block, which cannot be modified when placing and routing the higher level IC wiring. Even assuming that whitespace is available and recognized by the design tools, running a standard width wire 18 across the macro may not suffice, since the distance over which this wire is run (i.e., the horizontal width of the macro 12) may exceed that required for the maximum slew rate and delay.

Another option involves re-routing the wiring around the macro along the longer path 20, and using repowering circuits $22_1 \ldots 22_5$ to maintain the required slew rate and path delays while compensating for the excess path length. This approach, however, involves the use of valuable silicon area and power to support the repowering circuits, and may not be sufficient to meet path delay requirements.

What is required, therefore, are techniques for maintaining the required wiring slew rates and path delays across an entire IC in the presence of large, fixed macro blocks.

SUMMARY OF THE INVENTION

The present invention addresses the above problems during the design of the macros themselves by preparing the macros for anticipated subsequent stage wiring. The wiring and/or silicon whitespace areas of the macro are designed to accommodate the wiring. In that regard, the present invention, in one aspect is related to a method, system and corresponding computer program products (program code and data structures) directed to designing an IC macro, across which subsequent stage wiring is expected to run. A macro destined for the IC is identified, within which whitespace is identified available to facilitate the subsequent stage wiring running across the macro. The whitespace within the macro is designed especially to accommodate the subsequent stage wiring running across the macro.

The design of the whitespace of the macro may include rearranging wiring whitespace within the macro into at least one routing track to accommodate the wiring. The routing track may extend from one side of the macro to another side thereof and, to provide for decreased resistances, a width of the routing track may be greater than the minimum wiring width of the IC.

During the design of the macro whitespace, silicon whitespace may also be rearranged into circuit areas, optionally corresponding to the rearranged wiring whitespace. The presence of these circuit areas is conveyed through the design process to subsequent stage design, during which active circuits can be "dropped in" to these areas to support the subsequent stage wiring.

The whitespace of the macro may also include shielding to shield the wiring from areas of the macro bounding the whitespace. In one particularly unique embodiment of the present invention, the shielding comprises macro power bussing and/or macro wiring arranged to simultaneously effect shielding.

Other options for designing the macro whitespace to accommodate the subsequent stage wiring include, for example, designing power bussing in the whitespace for support circuits for the subsequent stage wiring. At least one active circuit may be designed into the whitespace to repower a signal within the wiring. For active circuits, pin areas are also designed in the macro for connection to the active circuit and for connection to the wiring, such that chip level design tools can connect the subsequently placed wiring to these accessible pins. The active circuits may be, e.g., repowering buffers or inverters.

In accordance with the present invention, by specially designing the whitespace of the macro to accommodate this subsequent stage wiring, including optional shielding, power bussing and/or active circuits, wiring can be effectively routed across the macro without adverse effects on the slew rate or path delay.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

BEST MODE FOR CARRYING OUT THE INVENTION

Figure 2:
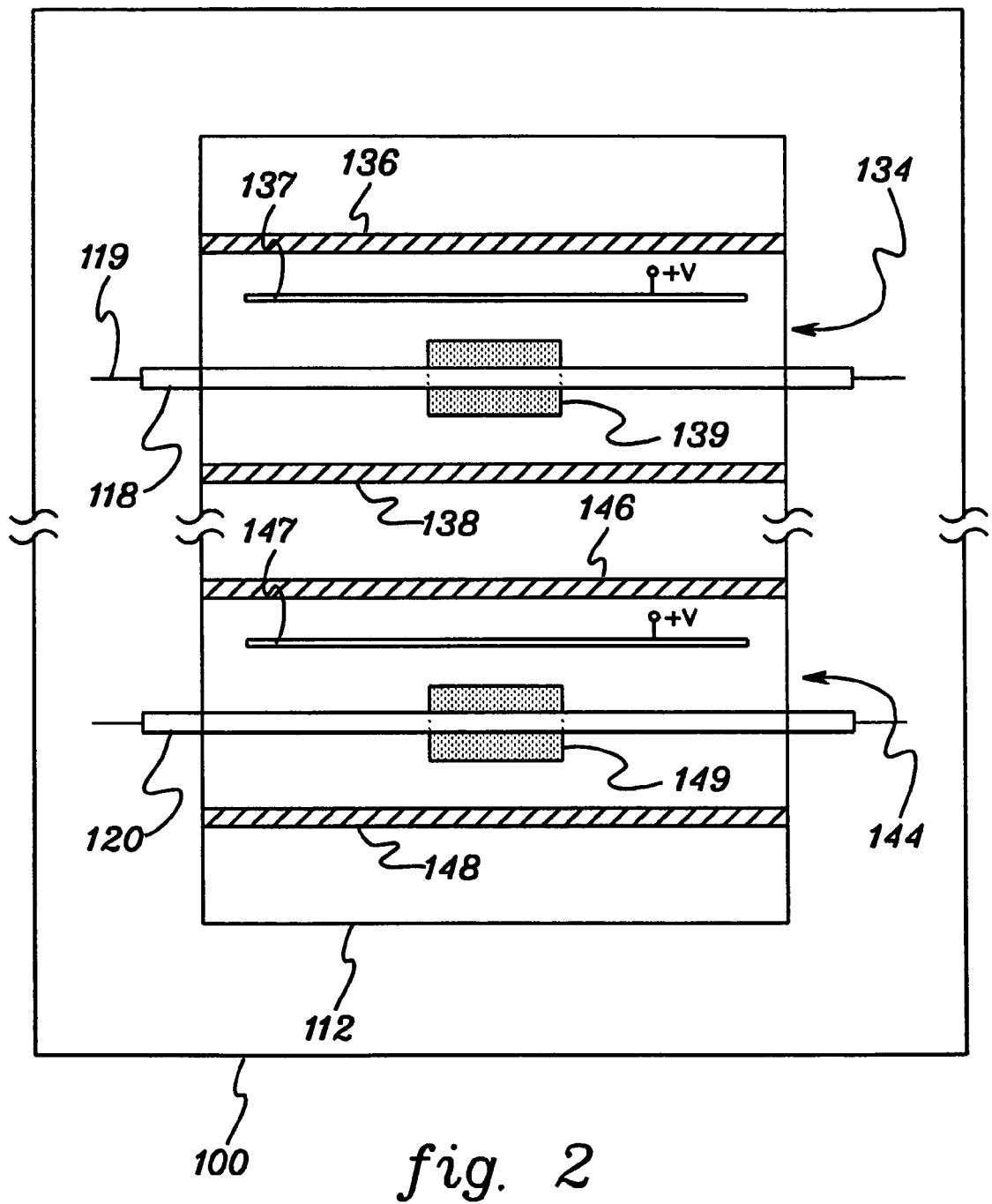
FIG. 2 depicts whitespace of the macro rearranged into routing tracks which may include other pre-designed features such as shielding, power bussing and silicon whitespace optionally corresponding to any tracks, in accordance with the present invention.
Figure 3:
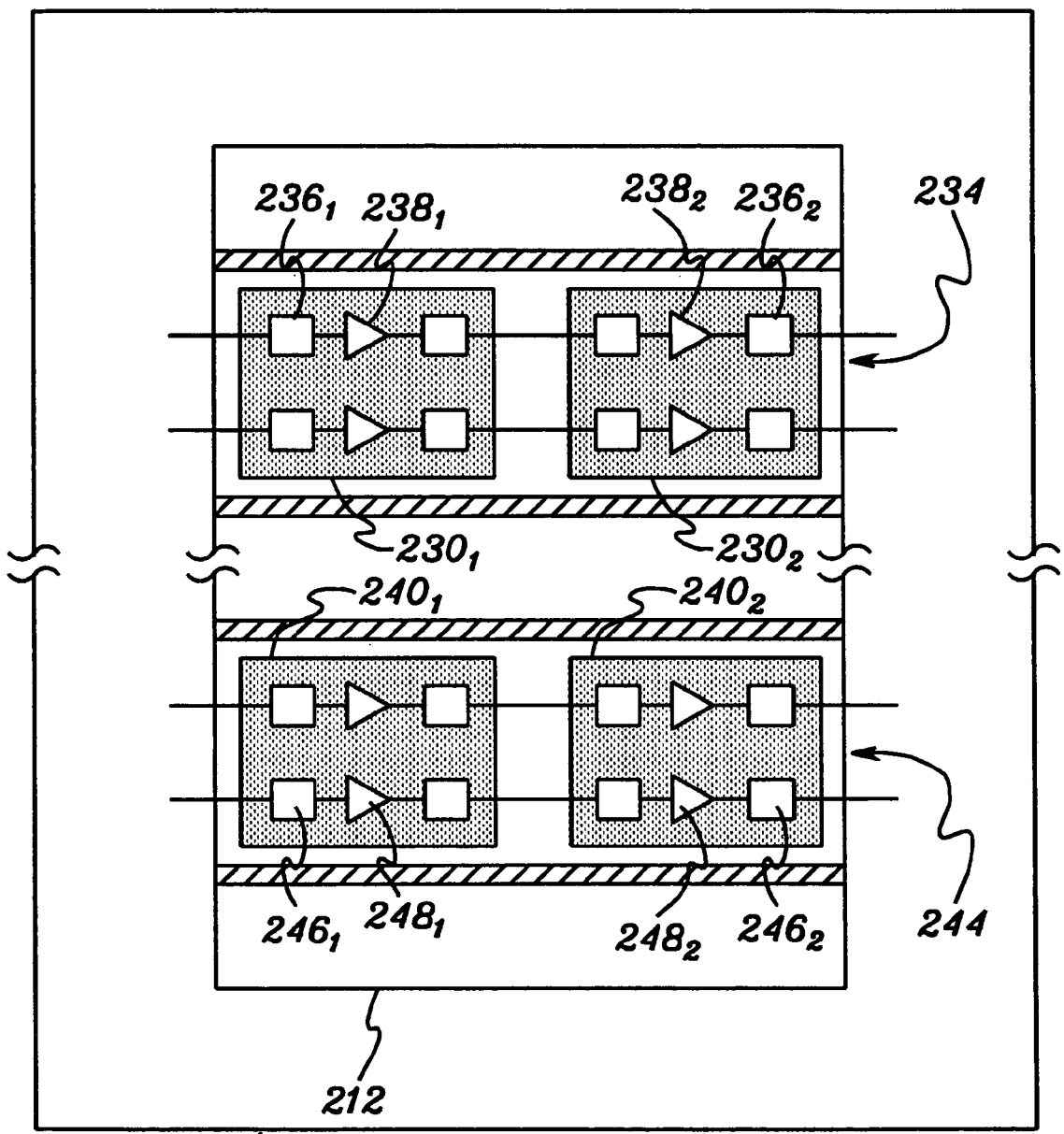
FIG. 3 depicts pre-placed, active circuits in the silicon whitespace of the macro with pins accessible to the IC wiring, in accordance with the present invention.
Figure 4:
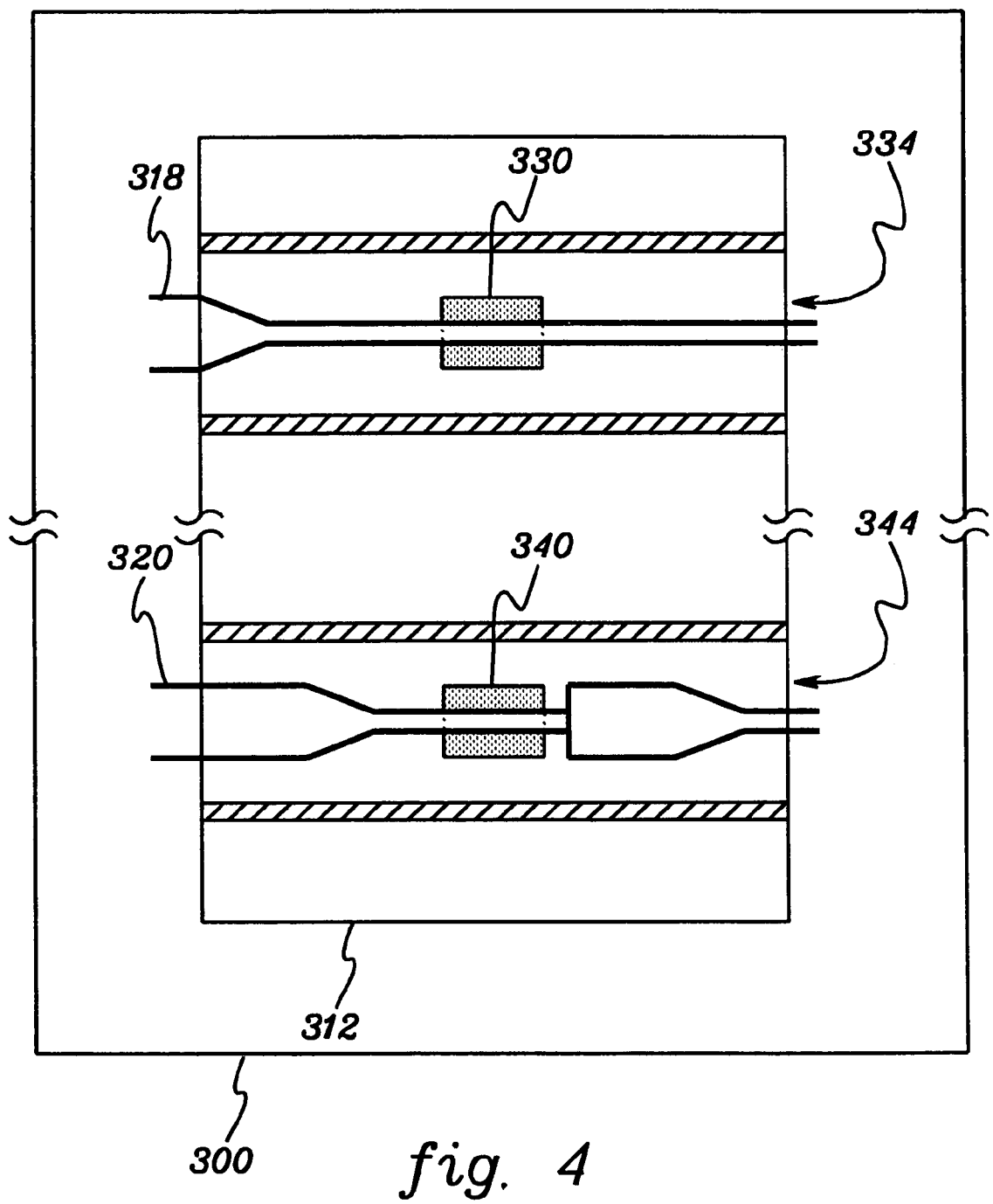
FIG. 4 depicts tapered wiring widths across the macro, in accordance with present invention.

As discussed above, the present invention is directed to the design of macros destined for implementation within subsequent, hierarchically designed stages of an IC, to accommodate wiring of those subsequent stages run across the macro. FIGS. 2–4 depict various embodiments of the macro having areas designed therein to accommodate this wiring.

With reference to FIG. 2, shown therein is IC 100 having macro 112 designed therein to accommodate wiring paths 118 and 120 in accordance with the present invention.

Those skilled in the art will recognize that known IC design systems support hierarchical design. For example, an IC design may repeatedly employ any one of a number of pre-designed "off-the-shelf" macros, to repeatedly perform the function for which they were previously designed. An IC design may also involve the sequential design of numerous custom macros having individual functions which, when combined in hierarchical design stages, cooperatively perform the desired IC function. The term "macro" is used broadly herein to connote any hierarchically-designed portion of an IC with circuits and wiring designed therein, having a defined function, and whose design has reached a substantially completed stage as defined within the relevant design system such that the macro is expected to perform its function without any further, significant changes thereto.

The present invention is directed to designing the macros to accommodate wiring not necessarily known yet, but which is expected to be run across the macro in subsequent, hierarchically designed stages of the IC. This is especially important for large macros which designers can safely assume will probably interfere with wiring in the subsequent stages, because of their size.

In accordance with the present invention, wiring tracks 134 and 144 and/or circuit areas 139 and 149 have been pre-designed into macro 112 to accommodate wiring 118 and 120 of subsequent hierarchical design stages, while maintaining the requisite slew rate and path delay of the wiring. (The term "across" is used broadly herein to connote any type of traversal of the macro by the wiring including over, under, through, etc. As discussed below, the "whitespace" within the macro designed to accommodate the wiring may have limitations such that straight paths are not possible. Therefore, the routing tracks may not take the straight paths depicted, but may follow circuitous routes "across" the macro.)

Figure 1:
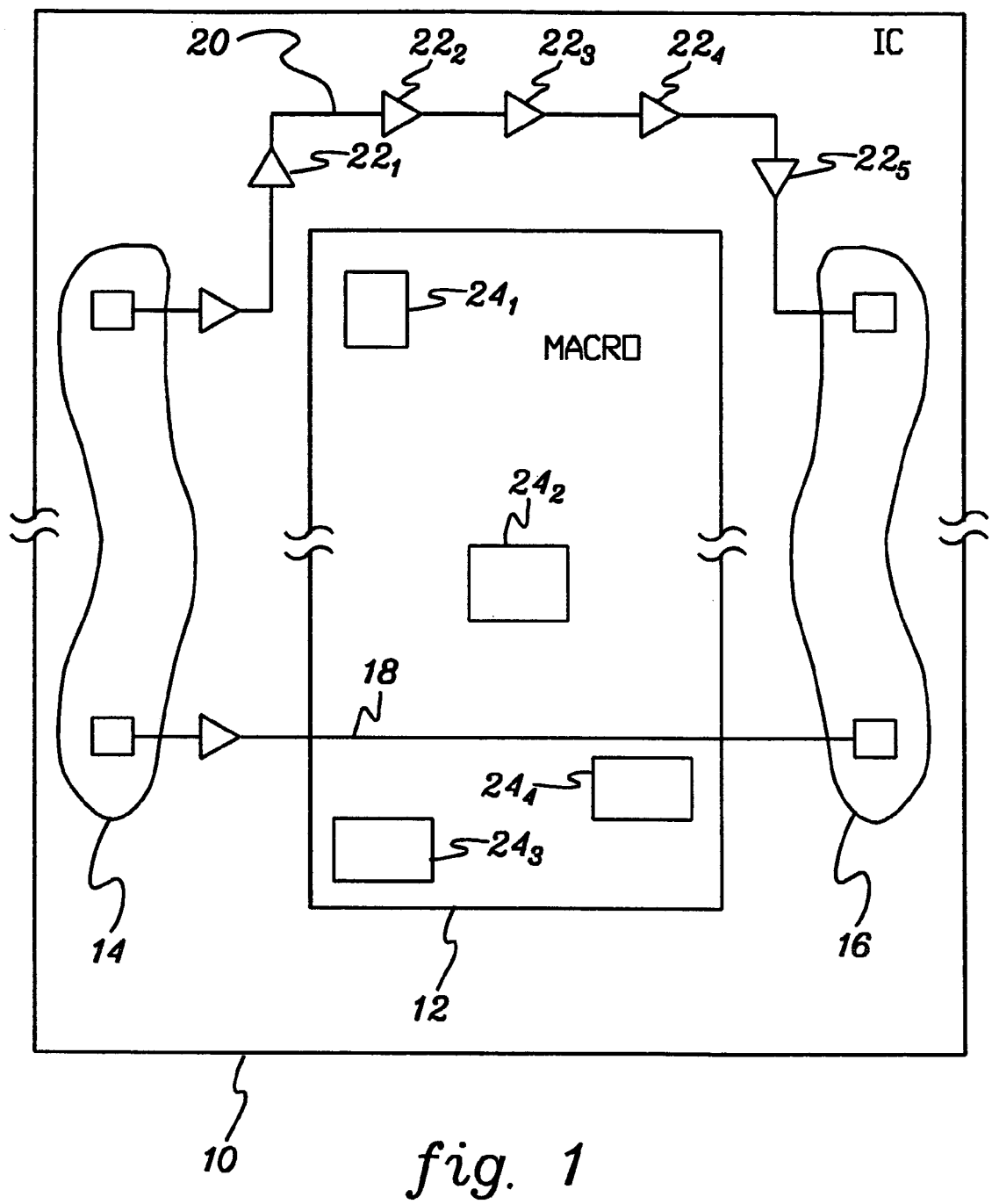
FIG. 1 presents the problem to which the present invention is directed, i.e., an integrated circuit requiring wiring routed around a fixed macro block.

The wiring tracks 134 and 144, and/or circuit areas 139 and 149, have been designed into the macro by rearranging the remnant whitespace of the macro (e.g., the whitespace areas $24_1$ ... $24_4$ of macro 12 of FIG. 1), in accordance with the principles of the present invention.

The rearranged whitespace can be wiring whitespace, silicon whitespace, a combination thereof, or any other type of excess space in the macro. Silicon whitespace connotes that which can support actual circuitry, while wiring whitespace connotes any open area on any wiring level in the macro.

Wiring tracks 134, 144 are normally comprised of rearranged wiring whitespace, however, additional areas of silicon whitespace can be rearranged into circuit areas 139 and 149 corresponding to the rearranged wiring whitespace to support additional, wiring support circuitry (either designed in during macro design, or designed in during subsequent stage design).

Alternatively, silicon whitespace can be rearranged into areas 139 and 149 alone to support additional, wiring support circuitry (either designed in during macro design, or designed in during higher stage design), without a rearrangement of any wiring whitespace into tracks.

The wiring is usually sized at a minimum width as it runs across the IC, for example, section 119 of wiring 118. In accordance with the present invention, routing track 134 (and the wiring section 118 through this track) are sized greater than the minimum IC wiring width, and preferably greater than about twice the minimum IC wiring width (e.g., twice the width), to support the proper slew rate and delay across the macro.

Additional features can be designed into the macro to support subsequent stage wiring across the macro, in accordance with the present invention. For example, power bussing 137 and 147 can be placed into the anticipated wiring areas for support circuitry used to support the wiring. In addition, the routing tracks can be bounded by shielding 136, 138, 146, 148 between sensitive areas of the macro and the routing tracks to minimize interference between these regions. In one embodiment, this shielding can be implemented with rearranged macro wiring and/or rearranged macro power busing.

The need for specially designed areas to support wiring inside macros is especially useful for very large macros, when the semiconductor technology wire definition cannot support routing across these large macro cells due to a combination of resistance and capacitance of the wires. The process of determining the minimum macro width which requires these openings includes examining multiple wire widths, electromigration, and output slew rate limits for a number of different wire lengths and high power level buffers or inverter cells. The high power level buffers or inverter cells typically would be required to cross the large macro cells. Floorplanning can try to reduce the number of critical paths which must cross large macro cells but cannot completely eliminate them. A worst case data switching frequency can be estimated by taking the half expected maximum clock frequency supported by the technology and using this value in the electromigration calculation. These and other calculations can be used to determine the widths of macros likely to require redesigned whitespace for subsequent stage wiring.

In addition to, or in place of, the generally "passive" modifications made to the macro set forth in FIG. 2, the principles of the present invention extend to the placement of active circuits in the macro to support the anticipated, subsequent stage wiring in accordance with the present invention.

With reference to the IC 200 and macro 212 combination of FIG. 3, macro 212 has pre-designed therein active circuits, e.g., pair 238$_1$ and 238$_2$, and pair 248$_1$ and 248$_2$. These active circuits (e.g., repowering buffers and/or inverters) include specially placed input and output pins 236$_1$, 236$_2$; and 246$_1$, 246$_2$, respectively. The pins are accessible to design tools during place and route of the subsequent stage wiring. The embedded active circuits, which would be otherwise inaccessible to the subsequent stage wiring, can therefore now be accessed using these pins. (The term "pin" is broadly used herein to connote any conductive area of the circuit to which conductive connections can be made to subsequent stage wiring levels.)

These active support circuits can be placed in rearranged silicon whitespace areas 230$_1$, 230$_2$ and 240$_1$, 240$_2$, respectively, during the design of the macro, which, as discussed above, can themselves be arranged to correspond to routing tracks 234 and 244, respectively.

Alternatively, in a preferred embodiment, support circuits can be placed in the rearranged silicon whitespace areas during the design of the subsequent hierarchical stage. Here, rather than seeing the macro as a fixed block, the design system is alerted to the presence of the rearranged whitespace in the macro and its availability to support circuitry for wiring. Repowering circuits can be designed into this whitespace (e.g., well contacts, latches, buffers and/or inverters). In one embodiment, latches can be designed, possibly in series across the length of the wiring path, for multi-cycle propagation of a signal across the wiring path. Pre-placed powering can be used for these circuits (e.g., bussing 137, 147 of FIG. 2), or additional power can be routed.

In another embodiment of the present invention, with reference to the IC 300 and macro 312 combination of FIG. 4, routing tracks 334 and 344 can be sized to hold tapered versions of wiring sections 318 and 320, respectively. This subsequent stage wiring can be tapered from larger to smaller sections thereof, to improve the RC response of the wiring. As is known to those skilled in the art, the wiring is narrowed to about the IC minimum width if tapping into circuit areas 330 or 340 for repowering or latching, as discussed above. The tapering can either be continuous in nature, such as that depicted in FIG. 4, or can be discretely stepped.

Figure 5A:
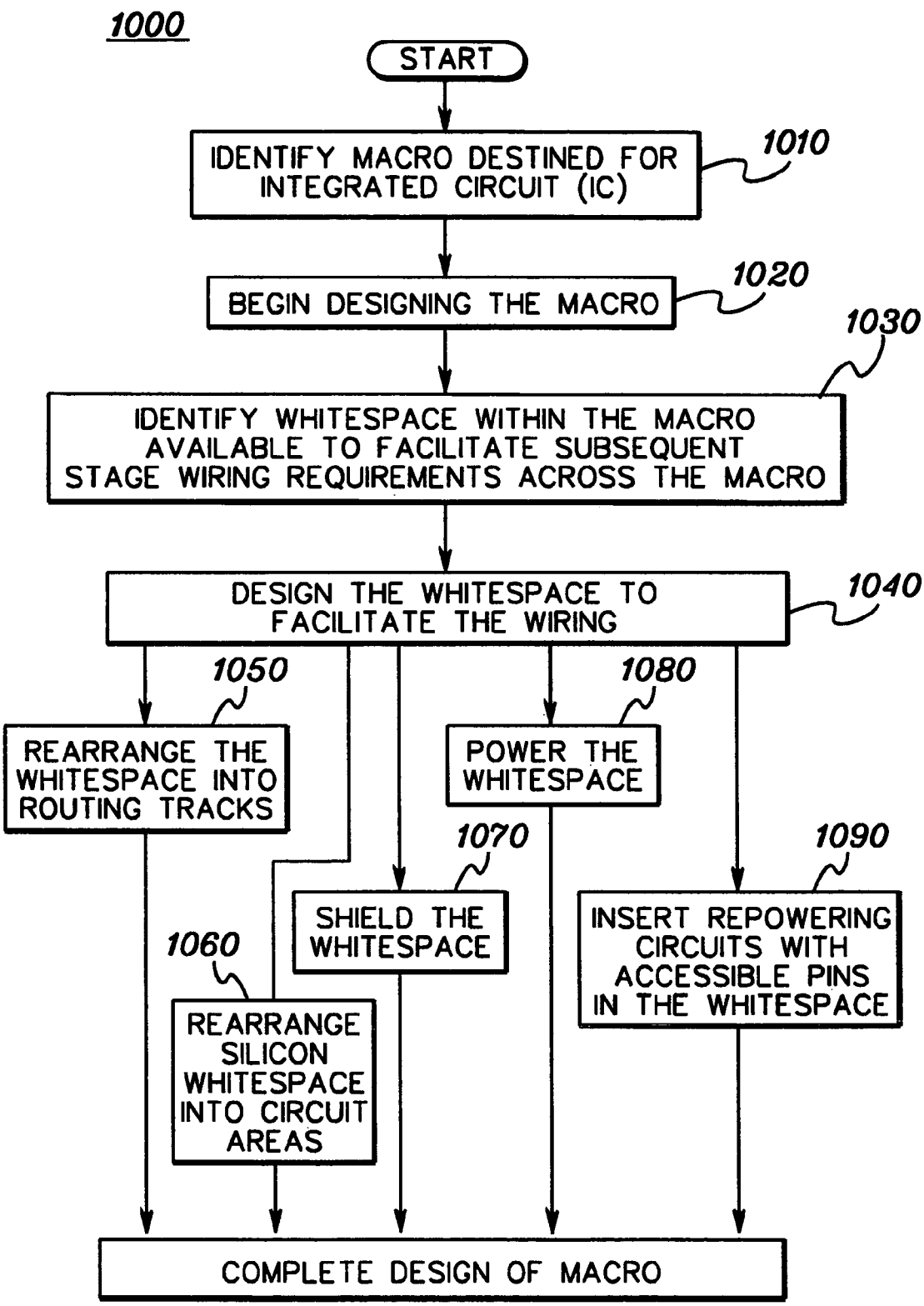
FIG. 5a depicts an exemplary sequence of macro design steps in accordance with the present invention.

The macro design steps of the present invention are depicted in flow diagram 1000 of FIG. 5a. In Step 1010, a macro is identified which is destined to be used during subsequent hierarchical design stages, followed by Step 1020 in which the design of the macro is initiated. In Step 1030, whitespace is identified within the macro available to facilitate subsequent stage wiring requirements across the macro, which may be known to varying degrees during this macro design process. This whitespace is usually remnant white space spread throughout the macro, such as areas 24 of FIG. 1. This whitespace is then designed to facilitate subsequent stage wiring in Step 1040 including any one or any combination of the following options:

Rearranging the wiring whitespace into routing tracks (Step 1050);

Rearranging the silicon whitespace into circuit areas, optionally corresponding to the rearranged wiring whitespace (Step 1060);

Shielding the whitespace with, e.g., macro power bussing and/or macro wiring rearranged into shielding areas (Step 1070);

Supplying power to the whitespace with power bussing (Step 1080); and

Inserting active circuits with accessible pins in the whitespace (Step 1090).

As stated above, any one of these design options can be invoked, or any combination thereof, in accordance with the principles of the present invention.

Figure 5B:
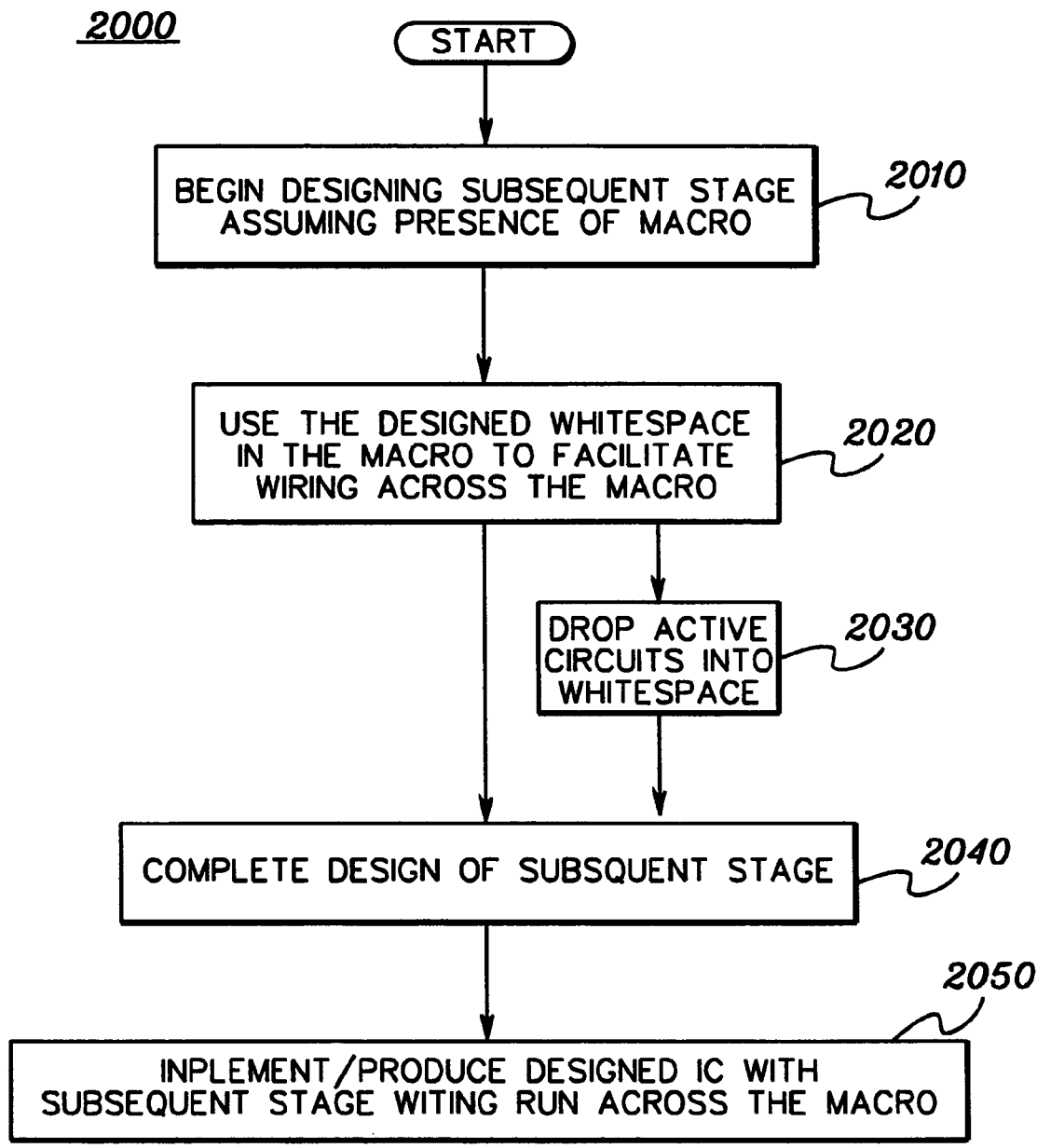
FIG. 5b depicts an exemplary sequence of subsequent stage design steps assuming a completed macro design.

With reference to the subsequent stage design sequence 2000 of FIG. 5b, design of this stage is initiated (Step 2010), assuming the presence of the designed macro of FIG. 5a. The designed whitespace in the macro is then used to facilitate subsequent stage wiring across the macro (Step 2020). Optionally, in Step 2030, active circuits are designed ("dropped") into the silicon whitespace rearranged in accordance with any or all of Steps 1050–1090 of the macro design sequence of FIG. 5a.

At this point, the design of the IC may be completed (Step 2040), and the IC is implemented and produced with the macro embedded therein, having the subsequent stage wiring running across the macro (Step 2050).

Figure 6:
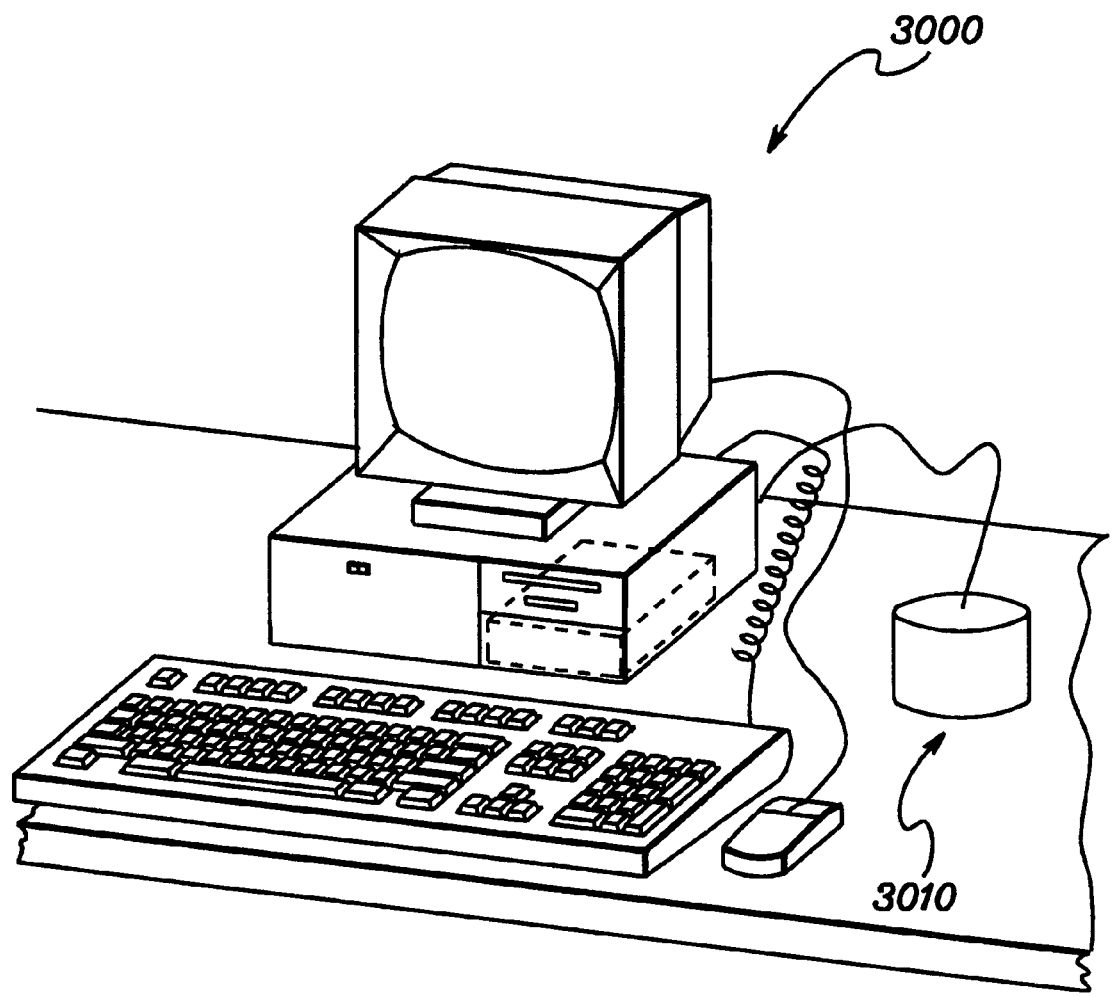
FIG. 6 depicts an exemplary data processing system and associated media upon which computer program product implementations of the present invention can be stored and executed.

With reference to FIG. 6, the present invention can be implemented as a design tool/computer program product for execution on, for example, the computer workstation 3000. In this implementation, the executable code and related macro/IC design data structures can be stored on any type of computer media 3010.

By pre-designing macros in anticipation of subsequent stage wiring requirements, greater flexibility is provided during the design of the subsequent stage, and slew rate and path delay requirements (timing closure) is greatly facilitated.

While the invention has been particularly shown and described with reference to preferred embodiment(s) thereof, it will be understood by those skilled in the art that various changes in form and details may be made therein without departing from the spirit and scope of the invention.

What is claimed is:

1. A computer memory for storing data for access by an application executed on a data processing system, comprising a data structure for an integrated circuit macro, across which wiring is expected to run, the data structure comprising:

information describing whitespace area within the macro designed to accommodate the wiring running across the macro, the whitespace area including at least one circuit area with at least one application specific circuit instantiation disposed therein.

2. The computer memory of claim 1, wherein the information describing the whitespace includes:

information describing wiring whitespace of the whitespace within the macro rearranged into at least one routing track to accommodate the wiring.

3. The computer memory of claim 2, wherein the information describing the whitespace includes:

information describing silicon whitespace of the whitespace within the macro rearranged into the at least one circuit area at least partially corresponding to the rearranged wiring whitespace.

4. The computer memory of claim 1, wherein the information describing the whitespace includes:

information describing at least one active circuit designed into the whitespace to facilitate a signal propagating in the wiring.

5. The computer memory of claim 1, further comprising: information describing the wiring run across the macro.

6. The computer memory of claim 5, wherein:
the information describing the whitespace includes information describing silicon whitespace of the whitespace rearranged within the macro into the at least one circuit area; and
the information describing the wiring includes information describing at least one circuit designed into the at least one circuit area of the macro to facilitate a signal propagating in the wiring.

7. A computer memory for storing data for access by an application executed on a data processing system, comprising a data structure for an integrated circuit ("IC") design, the data structure comprising:
information describing a macro for the IC, which includes a whitespace area rearranged to facilitate signals propagating in wiring within the whitespace area, the whitespace area including at least one circuit area with at least one application specific circuit instantiation disposed therein.

8. The computer memory of claim 7, wherein the rearranged whitespace of the macro includes:

wiring whitespace rearranged into at least wiring track; and/or silicon whitespace rearranged into the at least one circuit area; and/or shielding to shield the wiring from areas of the macro bounding the whitespace thereof; and/or power bussing for support circuits for the wiring.

9. The computer memory of claim 7, wherein the information describing the macro for the IC:

is from a library of macros not designed particularly for the IC; or is specially designed for the IC.

* * * * *